United States Patent
Welch, Jr.

(10) Patent No.: US 10,568,232 B2
(45) Date of Patent: Feb. 18, 2020

(54) MODULAR UNINTERRUPTIBLE POWER SUPPLY APPARATUS AND METHODS OF OPERATING SAME

(71) Applicant: Eaton Corporation, Cleveland, NC (US)

(72) Inventor: William Douglas Welch, Jr., Youngsville, NC (US)

(73) Assignee: Eaton Intelligent Power Limited (IE)

( * ) Notice: Subject to any disclaimer, the term of this patent is extended or adjusted under 35 U.S.C. 154(b) by 171 days.

(21) Appl. No.: 15/705,727

(22) Filed: Sep. 15, 2017

(65) Prior Publication Data

US 2018/0007807 A1 Jan. 4, 2018

Related U.S. Application Data

(63) Continuation of application No. 14/566,296, filed on Dec. 10, 2014, now Pat. No. 9,769,948.

(51) Int. Cl.
*H02J 9/06* (2006.01)
*H05K 7/14* (2006.01)

(52) U.S. Cl.
CPC .......... *H05K 7/1492* (2013.01); *H02J 9/062* (2013.01)

(58) Field of Classification Search
None
See application file for complete search history.

(56) References Cited

U.S. PATENT DOCUMENTS

| | | |
|---|---|---|
| 6,281,602 B1 | 8/2001 | Got et al. |
| 6,377,874 B1 | 4/2002 | Ykema |
| 6,738,692 B2 | 5/2004 | Schienbein et al. |
| 7,560,831 B2 | 7/2009 | Whitted et al. |
| 7,659,640 B1 | 2/2010 | El Houmaidi |

(Continued)

FOREIGN PATENT DOCUMENTS

| | | |
|---|---|---|
| CN | 201536275 | 7/2010 |
| CN | 102082495 | 6/2011 |

(Continued)

OTHER PUBLICATIONS

International Search Report and Written Opinion Corresponding to International Application No. PCT/US2015/063350; dated Mar. 4, 2016; 15 Pages.

(Continued)

*Primary Examiner* — Jared Fureman
*Assistant Examiner* — Aqeel H Bukhari
(74) *Attorney, Agent, or Firm* — Stanek Lemon Crouse & Meeks, P.A.

(57) ABSTRACT

An uninterruptible power supply system includes a plurality of functional modules interconnected to form a power distribution network coupling at least two power sources to a load. Each functional module has at least two ports coupled to at least one other of the functional modules and/or to at least one other external device and includes a control circuit configured to autonomously control at least one function relating to electrical power transfer between the at least two ports. The system further includes a controller module configured to communicate with each of the functional modules over at least one digital communication link to control power flow between the at least two power sources and the load.

8 Claims, 7 Drawing Sheets

(56) References Cited

U.S. PATENT DOCUMENTS

| | | | |
|---|---|---|---|
| 7,886,173 B2 | 2/2011 | Krieger et al. | |
| 8,344,546 B2 | 1/2013 | Sarti | |
| 2011/0187197 A1* | 8/2011 | Moth .................. | H02J 9/062 307/66 |
| 2011/0278932 A1* | 11/2011 | Navarro .................. | H02J 9/062 307/66 |
| 2012/0176088 A1 | 7/2012 | Lee | |
| 2012/0193987 A1* | 8/2012 | Siglock .................. | H02J 3/386 307/64 |
| 2016/0276870 A1 | 9/2016 | Olsen | |

FOREIGN PATENT DOCUMENTS

| | | |
|---|---|---|
| CN | 102570502 | 7/2012 |
| WO | WO 2008/133733 A1 | 11/2008 |
| WO | WO 2014/153592 A1 | 10/2014 |

OTHER PUBLICATIONS

Communication pursuant to Article 94(3) corresponding to EP Application No. 15813203.5; dated Jul. 30, 2018; 5 Pages.

* cited by examiner

MODULAR UNINTERRUPTIBLE POWER SUPPLY APPARATUS AND METHODS OF OPERATING SAME

CROSS-REFERENCE TO RELATED APPLICATION

This application is a continuation of U.S. patent application Ser. No. 14/566,296, filed on Dec. 10, 2014, the disclosure of which is incorporated herein by reference in its entirety.

BACKGROUND

The inventive subject matter relates to electric power systems and methods of operating the same and, more particularly, to uninterruptible power supply systems and methods of operating the same.

Conventional electrical power systems used in commercial applications, such as data centers, typically include various types of devices, such as switchgear units, transformers, power distribution units (PDUs) and uninterruptible power supplies (UPSs). These are typically single purpose units and are selected and interconnected to suit a particular application. For example, a conventional UPS used in data center power system may include a cabinet or a modular arrangement of cabinets that has a relatively fixed topology, e.g., a particular interconnection of rectifier, inverter and battery converter circuits that is designed to provide a power output from a primary source, such as a utility source, and a secondary source, such as a battery. The primary and secondary power sources may be connected to the UPS and other power network components using switchgear and other network components that typically are selected for the particular application. Such units may be difficult to integrate with one another and with other devices. Some UPS systems may have modular construction in order to facilitate capacity scaling and replacement in case of failure, but the modules used in such systems are typically configured for use in a fixed arrangement.

Large data centers have proliferated with the advent of web services and cloud computing. Some newer large data centers occupy millions of square feet and house hundreds of thousands of servers. These centers may have varying power requirements. For example, a data center may host both fault-tolerant applications, such as social media and video services, and fault-intolerant applications, such as financial applications. Energy consumption is a major concern for such facilities, as some facilities are approaching the 100 MW level, where even a few percentage points of lost efficiency can translate into significant expense. It may be desirable to power servers hosting fault-intolerant applications using highly reliable systems, such as on-line UPSs. However, running fault-tolerant applications on servers with a highly-reliable UPS may be relatively inefficient. Various solutions for providing power in data centers with relatively high efficiency and redundancy are proposed, for example, in U.S. Pat. No. 7,886,173 to Krieger et al., U.S. Pat. No. 7,560,831 to Whitted et al. and U.S. Pat. No. 8,344,546 to Sarti. These solutions, however, may be relatively inflexible and may not provide a sufficient breadth of capabilities.

SUMMARY

Some embodiments of the inventive subject matter provide an uninterruptible power supply system including a plurality of functional modules interconnected to form a power distribution network coupling at least two power sources to a load. Each functional module has at least two ports coupled to at least one other of the functional modules and/or to at least one other external device and includes a control circuit configured to autonomously control at least one function relating to electrical power transfer between the at least two ports. The system further includes a controller module configured to communicate with each of the functional modules over at least one digital communication link to control power flow between the at least two power sources and the load.

In some embodiments, each of the functional modules comprises a local controller circuit configured to autonomously control the at least one function and to communicate with the controller module. In further embodiments, the plurality of functional modules may include at least two functional modules coupled to at least two different power sources and at least one functional module coupled to at least one load and the controller module may be configured to communicate with the plurality of functional modules to selectively couple the at least two different power sources to the at least one load. The controller module may be configured to maintain a model for the system and to communicate with the plurality of functional modules according to the model.

The plurality of functional modules may include a switch module configured to provide at least one switch coupling at least one input port to at least one output port, wherein the control circuit of the switch module is configured to autonomously monitor at least one electrical parameter at the at least one input port and/or the at least one output port and responsively control the at least one switch. The control circuit of the switch module may be further configured to control the at least one switch responsive to a control signal received from the controller module via the at least one digital communications link. The at least one switch may include a double pole switch or a single pole switch.

The plurality of functional modules may further include a power converter module comprising a converter circuit coupled between first and second ports of the power converter module. The converter circuit may include, for example, a rectifier circuit, an inverter circuit or a DC/DC converter circuit.

Further embodiments provide a modular uninterruptible power supply system comprising a set of functional modules configured to be interconnected in a variety of different network configurations, each functional module having at least two ports configured to be coupled to at least one other functional module and/or to at least one other external device and a control circuit configured to autonomously control at least one function relating to electrical power transfer between the at least two ports. The system further includes a controller module configured to be coupled to selected functional modules of the set functional modules via at least one digital communication link and configurable to control power flow according to a network model corresponding to a network configuration of the selected functional modules.

Method embodiments may include interconnecting a plurality of functional modules to provide a network coupling at least two power sources and at least one load, each functional module having at least two ports configured to be coupled to at least one other functional module and/or to at least one other external device. A controller module is coupled to the functional modules using at least one digital communication link. Each functional module autonomously operate to control at least one function relating to electrical power transfer between the at least two ports of the functional module, and the controller module and the functional modules communicate to control power flow between the at least two power sources and the load.

DETAILED DESCRIPTION

Figure 1:
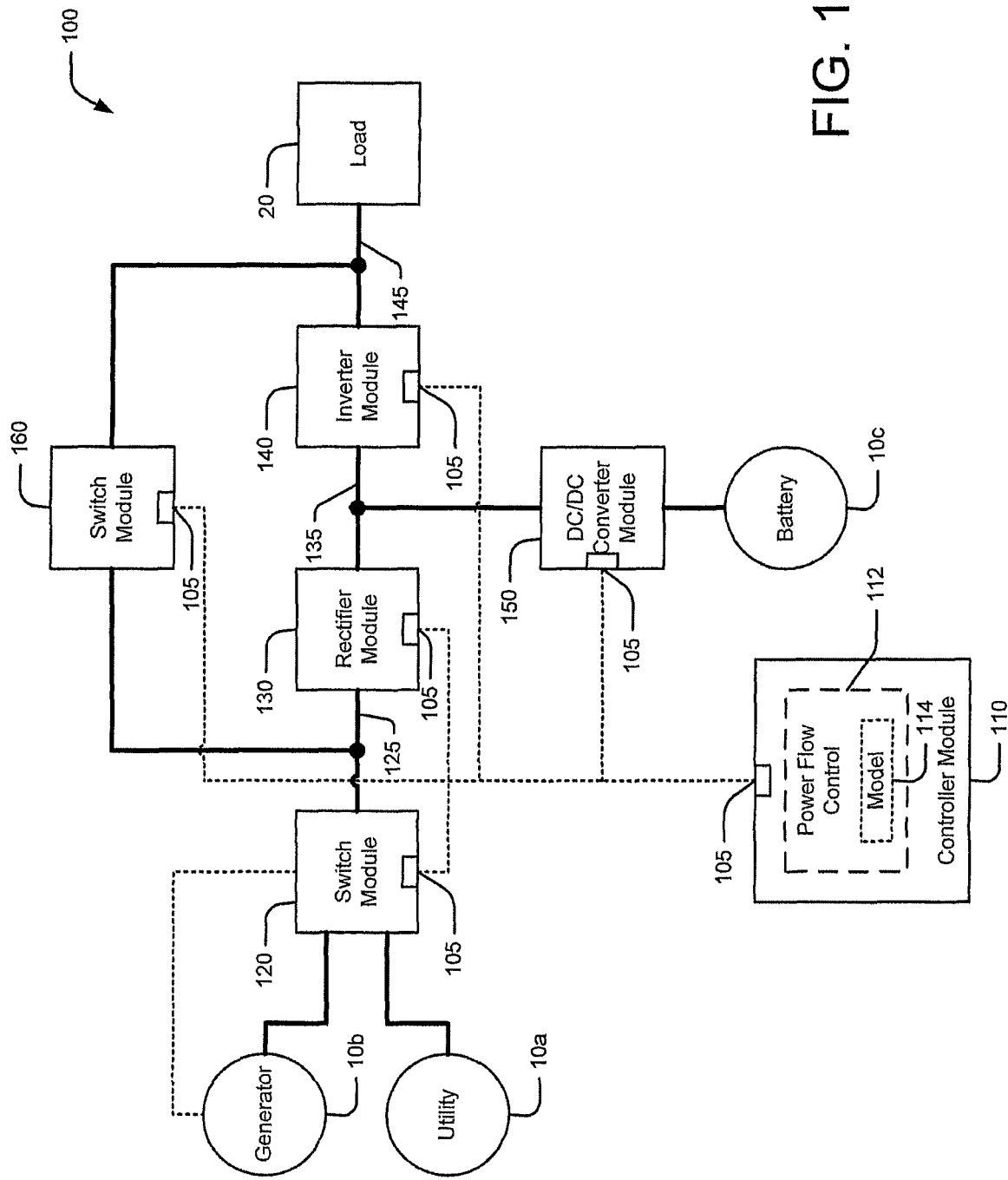
FIG. 1 is a schematic diagram illustrating an uninterruptible power supply system (UPS) according to some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

The inventive subject matter may be embodied as apparatus, methods and computer program products. Some embodiments may be described with reference to block diagrams and/or operational illustrations that illustrate structures and operations. Blocks of the block diagrams and/or operational illustrations may generally implemented using electric circuits configured to perform the specified functions. These "circuits" may generally be implemented using analog and/or digital circuitry. The circuits may comprise discrete components and/or integrated components, such as data processing integrated circuits (e.g., microprocessors, microcontrollers, digital signal processors and the like) and application-specific integrated circuits (ASICs).

Each block in such diagrams may represent a portion or segment of operations performed by computer-executable program code for implementing the specified logical function(s). Computer-executable program code may be provided one or more data processors, special purpose processors, ASICs, and/or other programmable data processing apparatus, such that the instructions, which execute to the code to provide the functions/acts specified in the block diagrams and/or operational block or blocks.

The computer-executable program code may also be stored in a non-transitory medium that may direct a controller circuit to function in a particular manner, such that the program code stored in the non-transitory medium constitute an article of manufacture including instructions that implement the functions specified in the block or blocks of the block diagrams and/or operational illustrations. The non-transitory medium may be, but is not limited to, an electronic, magnetic, optical, electromagnetic, or semiconductor system, apparatus, or device. More specific examples (a non-exhaustive list) of the non-transitory medium include the following: hard disk devices, optical storage devices, magnetic storage devices, random access memory (RAM) devices, read-only memory (ROM) devices, erasable programmable read-only memory (EPROM or Flash memory) devices, and compact disc read-only memory (CD-ROM).

Large uninterruptible power supply systems have traditionally been a compilation of multiple equipment components operating independently. For example, a typical system may include an automatic transfer switch (ATS) used to select between two AC sources, such as utility and generator. The output of the ATS may be connected to a UPS having rectifier, inverter, DC/DC converter, and a static switch, which can be internal or external. The system may also include additional downstream devices, such as a static transfer switch (STS) that selects between the UPS output and a secondary AC source to provide power to a critical load.

Some embodiments of the inventive subject matter arise from a realization that an improved solution to power supply design uses a set of functional modules that can be put together to form a complete system in various configurations are required by customers. Such a system may, for example, select between multiple AC and/or DC sources to provide controlled AC power to the critical load. Such an integrated system may, for example, maximize the total system efficiency, instead of just component efficiency, by selecting the preferred power source (AC or DC) under all operating conditions. In some embodiments, for example, a cost hierarchy of all of the power sources may be provided to a system controller module, which may select an optimum (e.g., lowest cost and/or highest reliability) power source based on availability and capabilities of the power sources.

Systems according to some embodiments may utilize a distributed processing architecture wherein each functional module has some degree of autonomy and local intelligence, e.g., a controller implemented in a microcontroller. Each module may sense its own input(s) and output and make basic decisions on its mode of operation, which may provide built-in redundancy and greater up-time for the system as a whole. The system can be modified by adding modules and/or changing module interconnections and module software.

Some embodiments of the inventive subject matter provide modular power systems in which functional modules, such as switch modules and converter modules, are configured for flexible interconnection to provide a variety of different uninterruptible power system topologies. The functional modules are configured to autonomously implement various switching and conversion functions and are coupled via one or more high-speed digital links, such as a controller area network (CAN) bus, to a system controller module that provides higher-level supervisory and control functions. In this manner, the same modules may be used, for example, to implement various on-line, standby and other UPS topologies, thus overcoming limitations of conventional UPS products that have fixed configurations. Embodiments of the invention subject matter may include, among other things, such functional modules and system control modules, as well as methods of operating such modular systems and computer program products supporting implementation of such modular systems.

FIG. 1 illustrates an uninterruptible power supply (UPS) system 100 according to some embodiments of the inventive subject matter. The system 100 includes a plurality of functional modules coupled in a network configuration, including a two-pole switch module 120, a rectifier module 130, an inverter module 140, a DC/DC converter module 150, and a single-pole switch module 160. These modules are interconnected by various buses, including an isolated AC input bus 125, a DC bus 135 and an output AC bus 145. The functional modules are separate assemblies having separate mechanical structures, e.g., frames and/or enclosures, that facilitate flexible interconnections among the modules. The functional modules may be configured to positioned apart from one another (e.g., in separate wall-mounted or freestanding cabinets) and/or may be configured to be installed together in other mechanical assemblies, such as in equipment racks. Conductors used to interconnect the modules 120, 130, 140, 150, 160 may take various forms, including, but not limited to, flexible cables, conduits, solid bus bars, bus ducts and the like. The connections of the modules to such conductors may take various forms, including, but not limited to, plugs and sockets, bolt-on or clamped cable terminals, bus bar stabs, and the like.

Each of the functional modules 120, 130, 140, 150, 160 is configured to operate in a semi-autonomous manner. For example, the 2-pole switch module 120, which is configured to selectively connect two power sources, here shown as a primary utility source 10a and backup generator 10b, to AC input bus 125, may be configured to sense loss of the primary source 10a and to responsively couple the generator 10b to the AC input bus 125. As shown, the switch module 120 may be further configured to signal the generator 10b to cause the generator 10b to start upon sensing failure of the primary utility source 10a.

The power converter modules, here including the rectifier module 130, inverter module 140 and the DC/DC converter module 150, may similarly operate in an autonomous manner. For example, the rectifier module 130 may include control circuitry configured to monitor voltages on the AC input bus 125 and the DC bus and may act to regulate a voltage on the DC bus 135. Similarly, the inverter module 140 may include control circuitry configured to regulate an AC output voltage produced on the AC output bus 145. The DC/DC converter module 150 may operate autonomously to provide power from a battery 10c to the DC bus 135 to maintain a voltage on the DC bus 135 and to charge the battery 10c. The single-pole switch module 160 may be also be configured to operate autonomously, e.g., it may include control circuitry configured to sense current passing therethrough and to responsive detect a condition, such as a backfeed to the AC input bus 160 or an overcurrent, and to interrupt the current to protect against damage from such a condition.

The functional modules 120, 130, 140, 150, 160 each include communications interface circuits 105 that support digital links with a communications interface circuit 105 of a controller module 110. The interface circuits 105 may, for example, be interconnected by one or more digital buses, and the interface circuits 105 may support communications over the one or more digital buses using a high-speed digital communications protocol, such as Controller Area Network (CAN). It will be understood, however, that the connections provided by interfaces 105 may take any of a number of different forms including, but not limited to, wired, optical and/or wireless connections. It will be further appreciated that the interface circuits 105 may also be configured to support peer-to-peer communications between the functional modules, independent of the controller module 110. Such peer-to-peer communications may be used, for example, for emergency or other signaling that may be unduly slowed by intermediation by the controller module 110.

The controller module 110 is configured to provide a power flow controller 112 which utilizes a system model 114 that controls interoperation of the autonomous functional modules. For example, as illustrated in FIG. 1, the functional modules 120, 130, 140, 150, 160 are interconnected in a topology that supports an on-line UPS operational scheme that is commonly used in applications such as data center power distribution. In particular, the two-pole switch module 120 is coupled to support operation as an input transfer switch, the rectifier module 130, the inverter module 140 and the DC/DC converter module 150 are interconnected to act as an on-line UPS converter core, and the single-pole switch module 160 is connected to act as a static bypass switch. The system model 114 of the power flow controller 112 models this topology, and the power flow controller 112 may monitor and control the various autonomous functional modules 120, 130, 140, 150, 160 according to the model 114 to support such on-line UPS operation. The control module 110 may be further configured to provide configuration information to the functional modules 120, 130, 140, 150, 160 including, for example, parameters and other configuration information for local control circuitry that controls the autonomous functions of the functional module or peer-to-peer signaling of the functional module with other functional modules. The control module 110 may also be configured to provide other supervisory functions, such as choice of power source based on factors such as availability and cost, as well as communications with other systems, such as a building management system (BMS).

Figure 2:
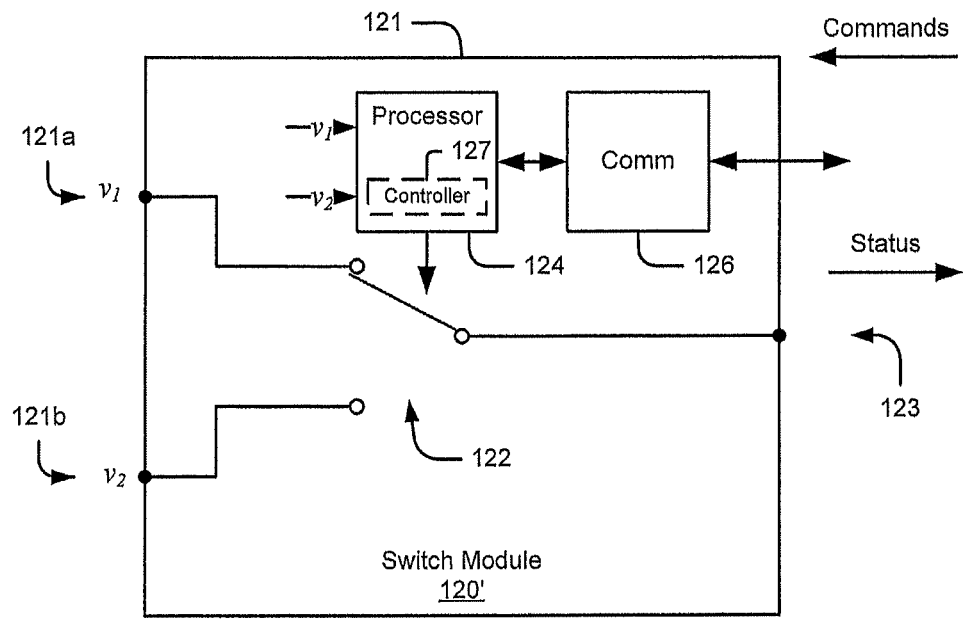
FIG. 2 illustrates an exemplary implementation of a two-pole switch module for use in the system of FIG. 1 according to some embodiments.

FIG. 2 illustrates an example of a two-pole switch module 120' according to some embodiments. The switch module 120' includes a frame 121, such as a cabinet, rack or other enclosure. The frame 121 supports at least one two-pole switch 122 coupled to first and second input ports 121a, 121b and an output port 123. The ports 121a, 121b, 123 may include, for example, wire, cable and/or bus bar connection structures (e.g., terminal blocks, plugs, sockets, clamps, etc.) that are supported by the frame 121. For three-phase power system application, the at least one switch 122 may include, for example, respective switches for respective phases. The at least one switch 122 is controlled by a processor circuit 124, which may include, for example, an integrated circuit data processing device and associated peripheral circuitry configured to control the at least one switch 122. For example, the at least one switch 122 may include at least one semiconductor power switching device, such as a silicon-controlled rectifier (SCR) or power MOSFET transistor, and the processor circuitry 124 may include an integrated circuit microcontroller and driver circuitry that interfaces the microcontroller to a gate or other control terminal of the at least one power semiconductor switching device. The processor circuit 124 may be programmed to implement a local controller 127 that controls the at least one switch 122 responsive to locally-monitored electrical parameters such as voltages $v_1$, $v_2$ at the input ports 121a, 121b. For example, the local controller 127 may be configured to cause the at least one switch 122 to selectively couple the input ports 121a, 121b to the output port 123 based on the locally monitored voltages $v_1$, $v_2$.

The processor circuit 124 is also coupled to a communications circuit 126 that provides communications with an external system controller module, such as the controller module 110 illustrated in FIG. 1. The communications circuit 126 may be configured to send status information to the external controller and to receive configuration information, commands and other data from the system controller for provision to the local controller 127. For example, the external controller may provide commands for operation of the at least one switch 122 to select between power sources coupled to the input ports 121a, 121b, with such commands being executed by the local controller 127 provided by the processor circuit 124. The local controller 127 provided by the processor circuit 124 may send information to the external controller, such as status information relating to the state of the at least one switch 122 and other components of the switch module 120' and information regarding electrical parameters, such as the input port voltages $v_1$, $v_2$.

It will be appreciated that a two-pole switch module along the lines illustrated in FIG. 2 may be used as an input selection switch as illustrated in FIG. 1. It will be further appreciated that such a module may be used in other arrangements. For example, such a switch module may be coupled to an output bus, such as the output bus 145 shown in FIG. 1, to allow provision of power to a load from another source (e.g., another utility source) in addition to the inverter module 140. An example of such an arrangement is described below with reference to FIG. 9. It will be appreciated that such switch modules may have various different ratings and may be selected appropriate to the application.

Figure 3:
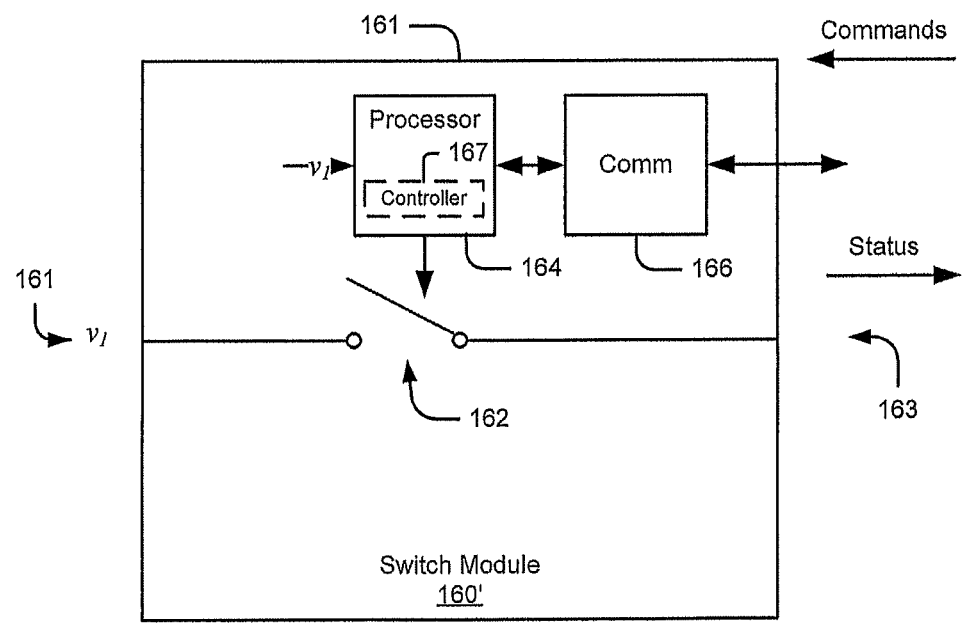
FIG. 3 illustrates an exemplary implementation of a single-pole switch module for use in the system of FIG. 1 according to some embodiments.

FIG. 3 illustrates an exemplary implementation of a single-pole switch module 160' according to some embodiments. The switch module 160' includes a frame 161, such as a cabinet, rack or other enclosure. The frame 161 supports at least one single-pole switch 162 coupled to an input port 161 and an output port 163. The ports 161, 163 may include, for example, wire, cable and/or bus bar connection structures that are supported by the frame 161. The at least one switch 162 may include, for example, respective switches for respective phases. The at least one switch 162 is controlled by a processor circuit 164 which, along lines discussed above, may include a microcontroller or similar data processing device, along with peripheral circuitry for interfacing such a data processing device to the at least one switch 162. The processor circuit 164 may be programmed to implement a local controller 167 that controls the at least one switch 162 responsive to locally-monitored electrical parameters such as a voltage v at the input port 161 or a current i passing through the at least one switch 162. For example, the local controller 167 may be configured to cause the at least one switch 162 to open responsive to a magnitude of the current i and/or a direction of power flow through the at least one switch 162.

The processor circuit 164 is also coupled to a communications circuit 166, which supports communications with an external system controller, such as the controller module 110 illustrated in FIG. 1. The communications circuit 166 may be configured to send status information to the external controller and receive configuration information, commands and other data from the system controller for provision to the local controller 167. For example, the communications circuit 166 may be configured to send status information to the external controller and receive commands from the system controller to control the at least one switch 162. The local controller 167 provided by the processor circuit 164 may send information to the external controller regarding electrical parameters, such as the input port voltage v, the current i and the state of the at least one switch 162.

Figure 4:
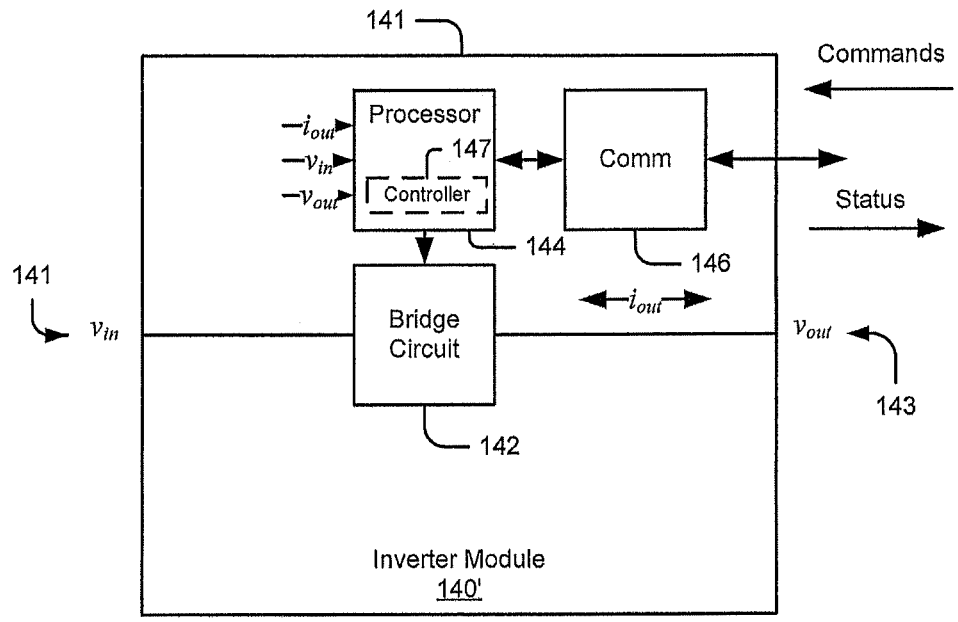
FIG. 4 illustrates an exemplary implementation of an inverter module for use in the system of FIG. 1 according to some embodiments.

FIG. 4 illustrates an exemplary implementation of an inverter module 140' according to some embodiments. The inverter module 140' includes a frame 141, such as a cabinet, rack or other enclosure. The frame 141 supports an input port 141 and an output port 143. The ports 141, 143 may include, for example, wire, cable and/or bus bar connection structures that are supported by the frame 141. The inverter module 140' includes a bridge circuit 142 coupled between the input port 141 and the output port 143 and controlled by a processor circuit 144. The bridge circuit 142 may include a plurality of semiconductor switching devices, such as isolated gate bipolar transistors (IGBTs) or power MOSFET devices. The processor circuit 144 may include a microcontroller or similar data processing device, along with peripheral circuitry for interfacing such a data processing device to the switching devices of the bridge circuit 142. The processor circuit 144 may be programmed to implement a local controller 147 that controls the bridge circuit 142 responsive to locally-monitored electrical parameters, such as a DC input voltage $v_{in}$ at the input port 141, an AC output voltage $v_{out}$ at the output port 143, and an output current $i_{out}$ at the output port 143, to generate the AC output voltage $v_{out}$ at the output port 143.

The processor circuit 144 is also coupled to a communications circuit 146, which supports communications with an external system controller, such as the controller module 110 illustrated in FIG. 1. The communications circuit 146 may be configured to send status information to the external controller and receive configuration information, commands and other data from the system controller for provision to the local controller 147. For example, the communications circuit 146 may be configured to send status information to the external controller and receive commands from the system controller to control the bridge circuit 142. The processor circuit 144 may send information to the external controller regarding electrical parameters, such as the input port voltage $v_{in}$, the output port voltage $v_{out}$, and the output current $i_{out}$.

Figure 5:
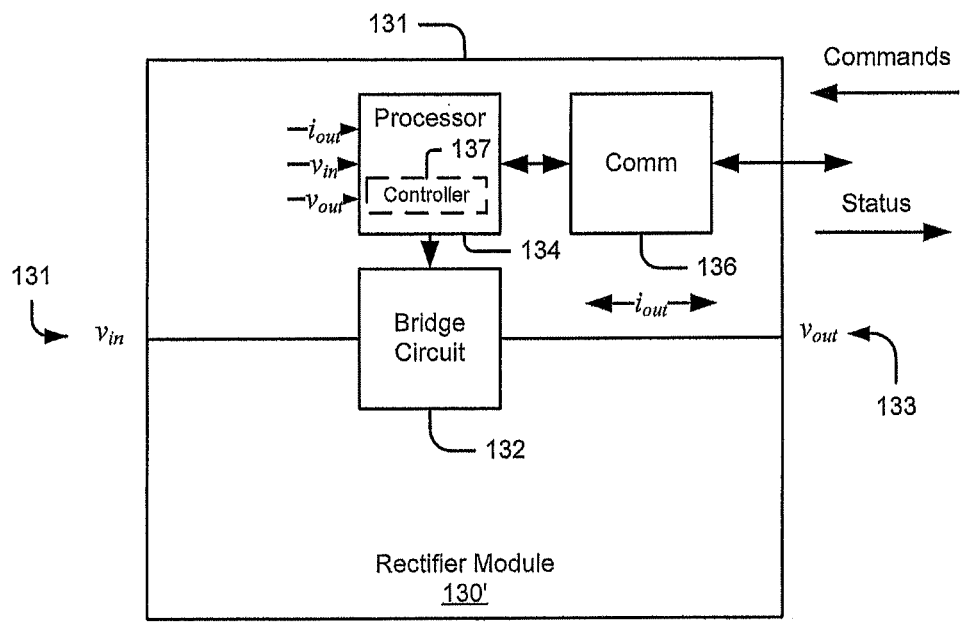
FIG. 5 illustrates an exemplary implementation of a rectifier module for use in the system of FIG. 1 according to some embodiments.

FIG. 5 illustrates an exemplary implementation of a rectifier module 130' according to some embodiments. The rectifier module 130' includes a frame 131, such as a cabinet, rack or other enclosure, which supports an input port 131 and an output port 133. The ports 131, 133 may include, for example, wire, cable and/or bus bar connection structures that are supported by the frame 131. The rectifier module 130' includes a bridge circuit 132 coupled between the input port 131 and the output port 133 and controlled by a processor circuit 134. The bridge circuit 132 may include a plurality of semiconductor switching devices, such as isolated gate bipolar transistors (IGBTs) or power MOSFET devices. The processor circuit 134 may include a microcontroller or similar data processing device, along with peripheral circuitry for interfacing such a data processing device to the switching devices of the bridge circuit 132. The processor circuit 134 may be programmed to implement a local controller 137 that controls the bridge circuit 132 responsive to locally-monitored electrical parameters, such as an AC input voltage $v_{in}$ at the input port 131, a DC output voltage $v_{out}$ at the output port 133, and an output current $i_{out}$ at the output port 133, to generate the DC output voltage $v_{out}$ at the output port 133.

The processor circuit 134 is also coupled to a communications circuit 136, which supports communications with an external system controller, such as the controller module 110 illustrated in FIG. 1. The communications circuit 136 may be configured to send status information to the external controller and receive configuration information, commands and other data from the system controller for provision to the local controller 137. For example, the communications circuit 136 may be configured to send status information to the external controller and receive commands from the system controller to control the bridge circuit 132. The local controller 137 provided by the processor circuit 134 may send information to the external controller regarding electrical parameters, such as the input port voltage $v_{in}$, the output port voltage $v_{out}$, and the output current $i_{out}$.

Figure 6:
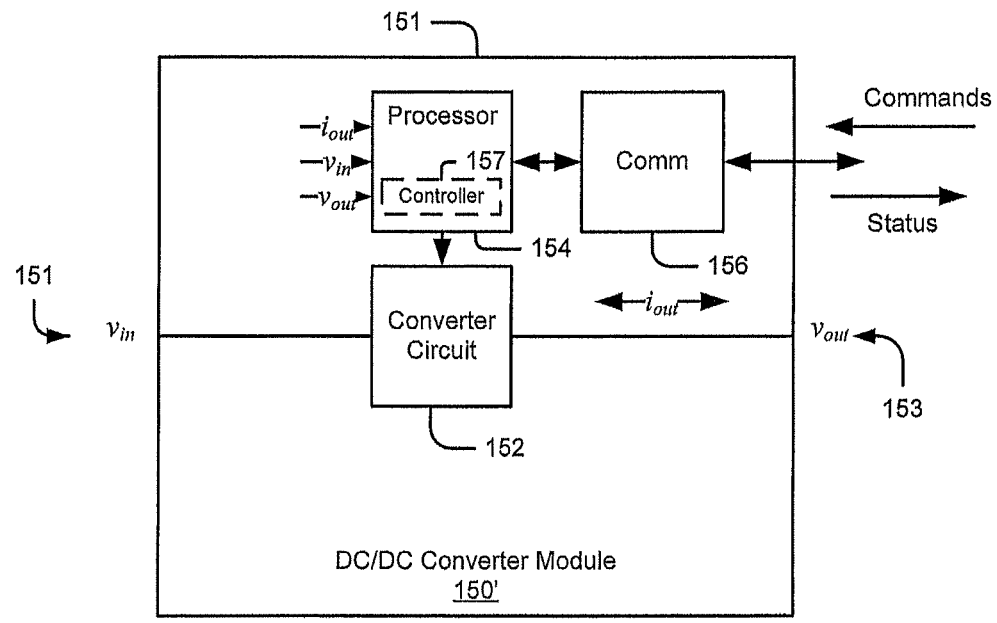
FIG. 6 illustrates an exemplary implementation of a DC/DC converter module for use in the system of FIG. 1 according to some embodiments.

FIG. 6 illustrates an exemplary implementation of a DC/DC converter module 150' according to some embodiments. The DC/DC converter module 150' includes a frame 151, such as a cabinet, rack or other enclosure. The frame 151 supports a first port 151 and a second port 153. The ports 151, 153 may include, for example, wire, cable and/or bus bar connection structures that are supported by the frame 151. The DC/DC converter module 150' includes a switching circuit 152 coupled between the first port 151 and the second port 153 and controlled by a processor circuit 154. The switching circuit 152 may include a plurality of semiconductor switching devices, such as isolated gate bipolar transistors (IGBTs) or power MOSFET devices. The processor circuit 154 may include a microcontroller or similar data processing device, along with peripheral circuitry for interfacing such a data processing device to the switching devices of the switching circuit 152. The processor circuit 154 may be programmed to implement a local controller 157 that controls the switching circuit 152 responsive to locally-monitored electrical parameters, such as a DC voltage v1 at the input port 151, a DC voltage v2 at the second port 153, a current it at the first port 151, and a current i2 at the second port 153. The local controller 157 may be configured to provide bidirectional power transfer between the first and second ports 151, 153.

The processor circuit 154 is also coupled to a communications circuit 156, which supports communications with an external system controller, such as the controller module 110 illustrated in FIG. 1. The communications circuit 156 may be configured to send status information to the external controller and receive configuration information, commands and other data from the system controller to control the switching circuit 152. For example, the communications circuit 156 may be configured to send status information to the external controller and receive commands from the system controller for provision to the local controller 157. The local controller 157 may send information to the external controller regarding electrical parameters of the module 150', such as the DC voltage $v_1$ at the input port 151, the DC voltage $v_2$ at the second port 153, the current $i_1$ at the first port 151, and the current $i_2$ at the second port 153.

Figure 7:
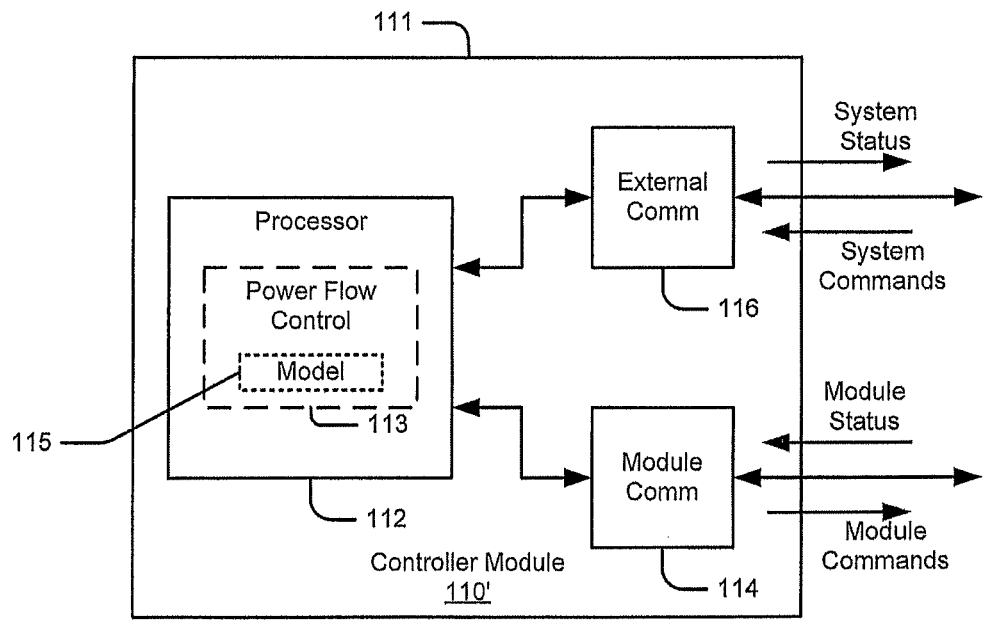
FIG. 7 illustrates an exemplary implementation of a system controller module for use in the system of FIG. 1 according to some embodiments.

FIG. 7 illustrates an exemplary implementation of a system controller module 110' according to some embodiments. The system controller module 110' includes a frame 111, such as a cabinet, rack or other enclosure. The system controller module 110' includes a processor circuit 112, which may be implemented using, for example, a microcontroller or similar integrated circuit device, along with peripheral circuitry, such as memory circuitry. The processor circuit 112 is configured (e.g., programmed) to provide a power flow controller 113 that supervises and controls operations of autonomous functional modules, such as the modules illustrated in FIGS. 2-6, via a module communications circuit 114. The power flow controller 113 may utilize a system model 115 that defines relationships among the various functional modules, as described above. As further shown, the system controller module 110' may further include an external communications circuit 116, which may be used to interface the module 110' to an external system, such as a building management system (BMS).

Figure 8:
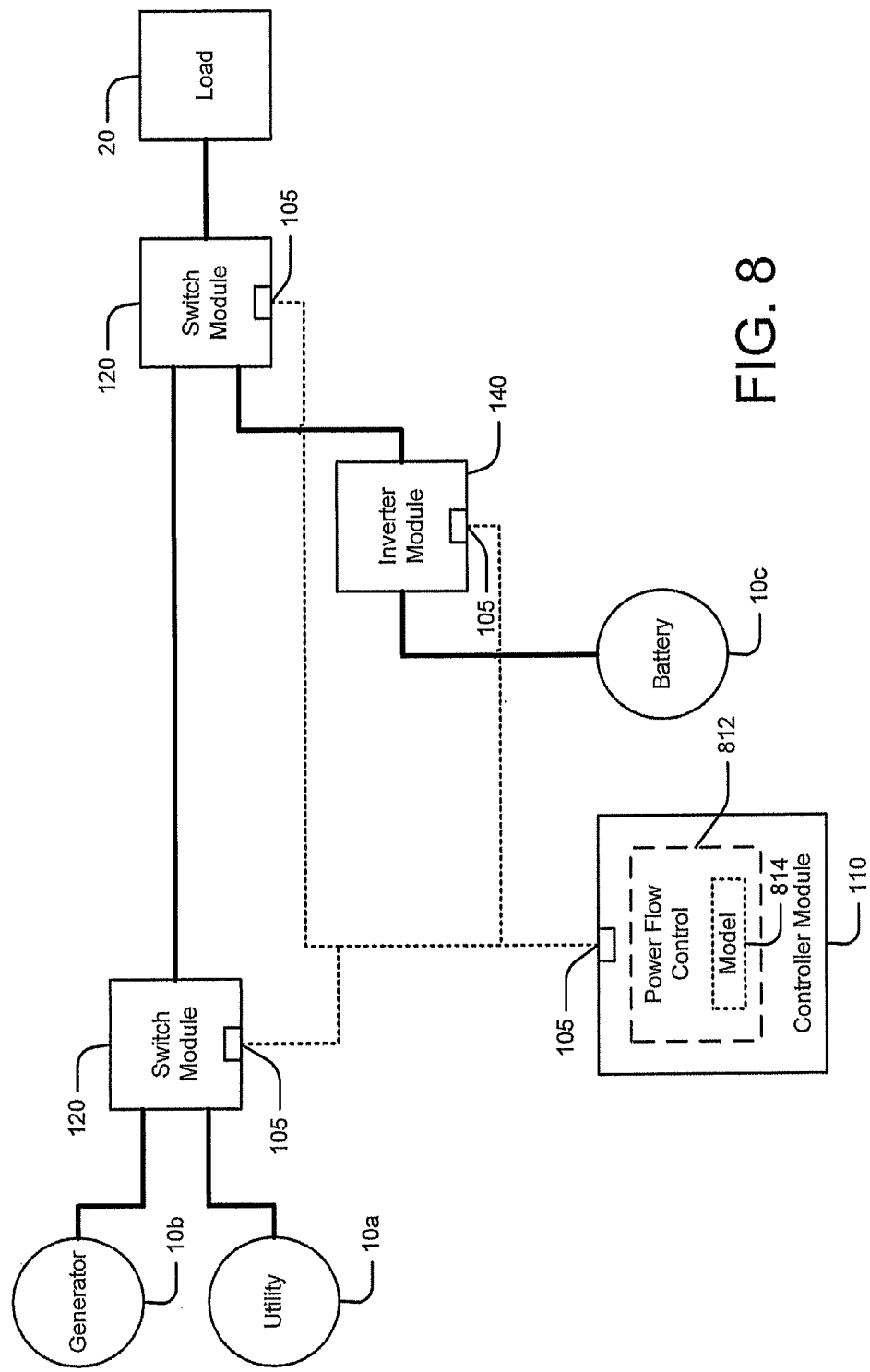
FIG. 8 is a schematic diagram illustrating an uninterruptible power supply system (UPS) according to some embodiments.

FIG. 8 illustrates how functional and system controller modules described above in reference to FIGS. 1-7 may be used to implement a different UPS topology than the on-line topology illustrated in FIG. 1. In particular, FIG. 8 illustrates a system 800 having an off-line or standby topology. The system 800 includes a two-pole switch module 120, here again used to act as an input transfer switch for selecting from among a utility power source 10a and a generator 10b. The system 800 also includes a second two-pole switch module 120 used as an output transfer switch for selecting between a battery-fed inverter module 140 and the output of the first switch module 120. A system controller module 110 is configured to control the switch modules 120 and the inverter module 140 to support off-line or standby operation. In particular, the system controller module 110 provides a power flow controller 812 that operates according to a network model 814 that supports such UPS operations.

Figure 9:
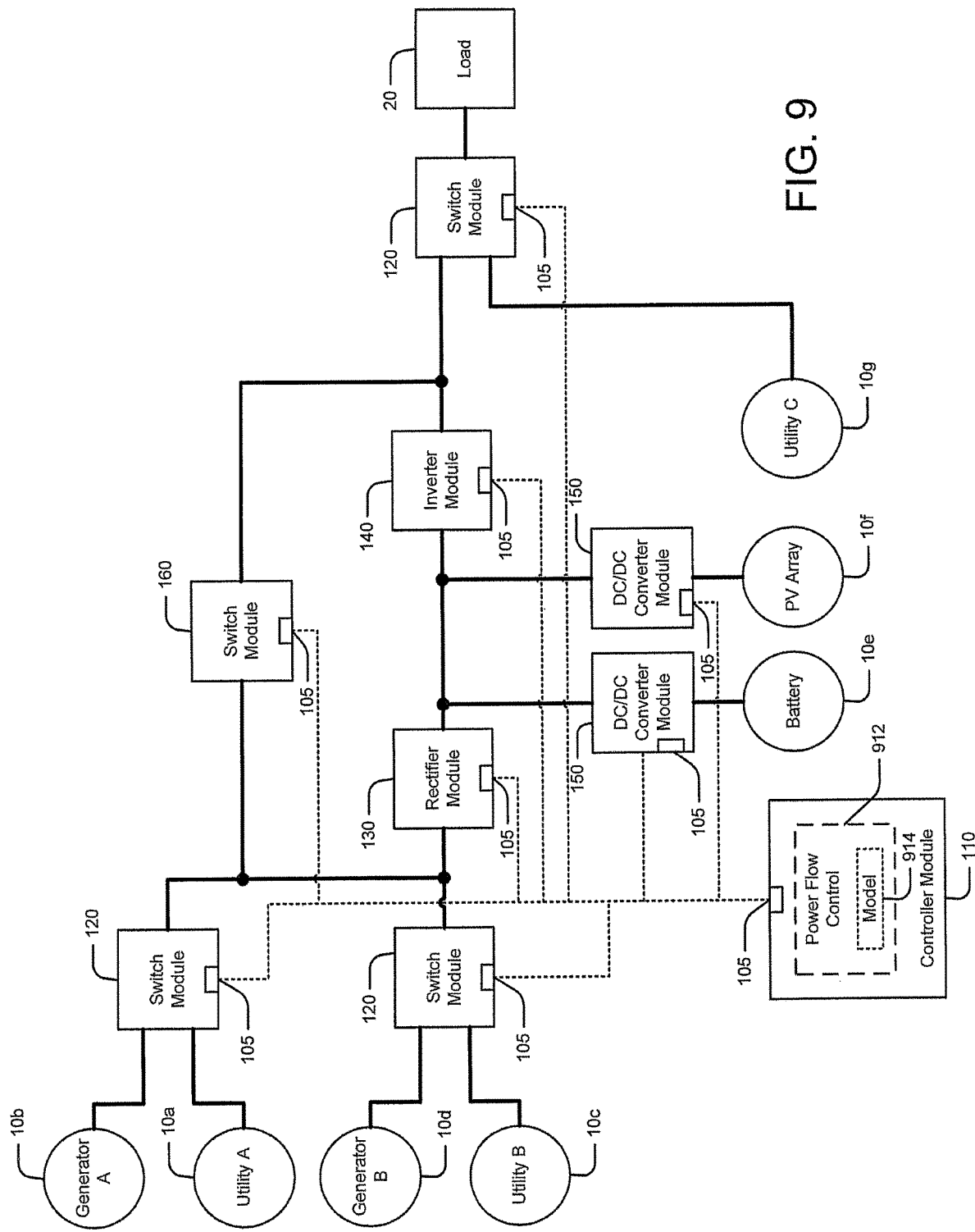
FIG. 9 is a schematic diagram illustrating an uninterruptible power supply system (UPS) according to further embodiments.

Modules along the lines discussed above may also be used to implement more complex topologies. For example, FIG. 9 illustrates a system 900 that includes a rectifier module 130, inverter module 140 linked by a DC bus 135 similar to the system 100 of FIG. 1. However, the system 900 includes two two-pole switch modules 120 that are coupled to an input AC bus 125 to selectively provide power from among four sources, including separate utility sources 10a, 10c and separate generators 10b, 10d. Respective first and second DC/DC converter modules 150 couple a battery 10e and a photovoltaic (PV) array 10f to the DC bus 135. A third two-pole switch module 120 selectively couples the inverter module 140 and a third utility source 10g to a load 20. A system controller module 110 is coupled to the various functional modules via high-speed digital data links and is configured to support operation of the system 900. The system controller module 110 provides a power flow controller 912 that operates according to a network model 914 that supports on-line UPS operations. The power flow controller 912 may be further configured, for example, to select among the various power sources based on availability, cost and other information. For example, the power flow controller 912 may select from among the utility sources 10a, 10c, the generators 10b, 10d and the PV array 10f based upon factors such as weather conditions, time of day, utility rates and/or fuel costs.

As discussed above, function and system controller modules as described above may be flexibly interconnected to support a variety of different power supply system configurations. For example, a modular product system may include a set of functional modules that may be selected and interconnected to form any of a variety of different network configurations. Each functional module may have at least two ports configured to be coupled to at least one other functional module and/or to at least one other external device and a control circuit configured to autonomously control at least one function relating to electrical power transfer between the at least two ports. A system designer may select modules from the set of functional modules and interconnect the functional modules in a manner that support a particular type of system configuration, such as the UPS configurations described above. A controller module may be coupled to the selected functional modules via at least one digital communication link, such as a CAN bus. The controller module may be programmed to maintain a network model corresponding to the interconnection of the functional modules, and may control power flow in the network including the selected functional modules.

Figure 10:
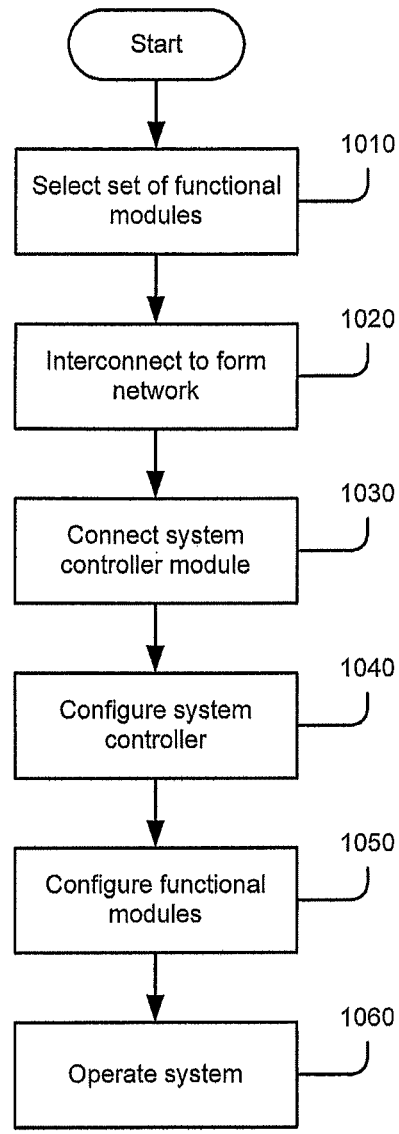
FIG. 10 is a flowchart illustrating operations for fabricating a modular power supply system according to some embodiments.

FIG. 10 illustrates an example of operations for fabricating system according to some embodiments. A set of functional modules is selected and interconnected to form a network (blocks 1010, 1020). A system controller module is connected to the functional modules via one or more digital communications links (block 1030). The system controller module is configured to support a network model corresponding to the interconnected functional modules (block 1040). The system controller module may also configure the selected functional modules, e.g., may transmit parameters for autonomous operation of the modules (block 1050). The system may then be operated to provide selective power flow between at least two power sources and a load (block 1060).

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. An apparatus comprising:
    a communications interface configured for communication with functional modules that are flexibly interconnectable to form a variety of different power distribution system topologies; and
    a controller operatively coupled to the communications interface and flexibly configurable to use respective different network models to support respective ones the different power distribution system topologies, wherein the functional modules autonomously control power flow responsive to electrical parameters locally measured by the functional modules based on configuration information transmitted to the functional modules from the controller.

2. The apparatus of claim 1, wherein the functional modules comprise at least two functional modules coupled to at least two different power sources and at least one functional module coupled to at least one load and wherein the controller is configured to cause the functional modules to selectively couple at least two different power sources to at least one load.

3. A system comprising the apparatus of claim 1 coupled to a plurality of the functional modules via the communications interface.

4. A functional module for a power distribution system, the module comprising:
    at least two ports flexibly interconnectable with other functional modules to provide a variety of different power distribution system topologies;
    a communications interface configured to be coupled to a system controller that uses respective different network models to support respective ones of the different power distribution system topologies;
    a functional circuit configured to control power transfer between the at least two ports; and
    a control circuit configured to autonomously control the functional circuit responsive to at least one locally measured electrical parameter and further configured to control the functional circuit responsive to communications with the system controller via the communications interface.

5. The module of claim 4, wherein the functional circuit comprises at least one switch configured to selectively couple first and second ports of the module, and wherein the control circuit is configured to autonomously monitor the at least one electrical parameter at one of the at least two ports and to autonomously control the at least one switch responsive to the monitored at least one electrical parameter and wherein the control circuit is further configured to control the at least one switch responsive to a control signal received from the controller.

6. The module of claim 4, wherein the functional circuit comprises a power converter circuit coupled between first and second ports of the module and wherein the control circuit is configured to control the converter circuit to autonomously regulate an output of the converter circuit.

7. The apparatus of claim 1, wherein the functional modules include at least one switch module and at least one power converter module.

8. The module of claim 4, wherein the control circuit is configured to receive configuration information from the system controller via the communications interface, wherein the configuration information configures the control circuit to autonomously control the functional circuit responsive to the at least one locally measured electrical parameter.

* * * * *